(12) United States Patent
Langdo et al.

(10) Patent No.: US 9,548,236 B2
(45) Date of Patent: Jan. 17, 2017

(54) METHODS OF FORMING STRAINED-SEMICONDUCTOR-ON-INSULATOR DEVICE STRUCTURES

(71) Applicant: Taiwan Semiconductor Manufacturing Company, Ltd., Hsin-Chu (TW)

(72) Inventors: Thomas A. Langdo, Cambridge, MA (US); Matthew T. Currie, Brookline, MA (US); Richard Hammond, Harriseahead (GB); Anthony J. Lochtefeld, Ipswich, MA (US); Eugene A. Fitzgerald, Windham, NH (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 14/270,095

(22) Filed: May 5, 2014

(65) Prior Publication Data

US 2014/0242778 A1    Aug. 28, 2014

Related U.S. Application Data

(62) Division of application No. 11/073,780, filed on Mar. 7, 2005, now Pat. No. 8,748,292, which is a division of application No. 10/264,935, filed on Oct. 4, 2002, now abandoned.

(60) Provisional application No. 60/386,968, filed on Jun. 7, 2002, provisional application No. 60/404,058, filed on Aug. 15, 2002.

(51) Int. Cl.
*H01L 21/30* (2006.01)
*H01L 29/06* (2006.01)
*H01L 21/762* (2006.01)
*H01L 21/84* (2006.01)
*H01L 27/12* (2006.01)
*H01L 29/66* (2006.01)
*H01L 29/78* (2006.01)
*H01L 29/786* (2006.01)
*H01L 21/02* (2006.01)

(52) U.S. Cl.
CPC ... *H01L 21/76254* (2013.01); *H01L 21/76259* (2013.01); *H01L 21/76264* (2013.01); *H01L 21/84* (2013.01); *H01L 27/1203* (2013.01); *H01L 29/66772* (2013.01); *H01L 29/66916* (2013.01); *H01L 29/7842* (2013.01); *H01L 29/78603* (2013.01); *H01L 29/78684* (2013.01); *H01L 29/78687* (2013.01); *H01L 21/0245* (2013.01); *H01L 21/0251* (2013.01); *H01L 21/02381* (2013.01); *H01L 21/02502* (2013.01); *H01L 21/02505* (2013.01); *H01L 21/02521* (2013.01); *H01L 21/02532* (2013.01); *H01L 21/76275* (2013.01)

(58) Field of Classification Search
CPC .................................. H01L 21/76254
USPC .... 438/406, 455, 459, 479, 517; 257/18, 19, 257/347–354
See application file for complete search history.

(56) References Cited

U.S. PATENT DOCUMENTS 5,223,734 A * 6/1993 Lowrey ............... H01L 21/3221
                                                           257/350
6,059,895 A * 5/2000 Chu ................... H01L 21/02381
                                                           148/33.1

(Continued)

*Primary Examiner* — Ori Nadav
(74) *Attorney, Agent, or Firm* — Slater Matsil, LLP

(57) ABSTRACT

The benefits of strained semiconductors are combined with silicon-on-insulator approaches to substrate and device fabrication.

20 Claims, 10 Drawing Sheets

(56) References Cited

U.S. PATENT DOCUMENTS

| | | | |
|---|---|---|---|
| 6,524,935 B1 | 2/2003 | Canaperi et al. | |
| 6,603,156 B2 | 8/2003 | Rim | |
| 6,649,492 B2 | 11/2003 | Chu et al. | |
| 6,936,869 B2 | 8/2005 | Webb et al. | |
| 6,995,430 B2 | 2/2006 | Langdo et al. | |
| 7,038,277 B2 | 5/2006 | Chu et al. | |
| 7,045,836 B2 * | 5/2006 | Lee | H01L 21/02381 257/288 |
| 7,259,388 B2 | 8/2007 | Langdo et al. | |
| 7,297,612 B2 | 11/2007 | Langdo et al. | |
| 7,420,201 B2 | 9/2008 | Langdo et al. | |
| 7,588,994 B2 | 9/2009 | Langdo et al. | |
| 8,026,534 B2 | 9/2011 | Langdo et al. | |
| 9,064,930 B2 | 6/2015 | Langdo et al. | |
| 2001/0017417 A1 * | 8/2001 | Kuroda | H01L 21/28525 257/758 |
| 2003/0021966 A1 * | 1/2003 | Segal | B82Y 10/00 428/209 |
| 2003/0025131 A1 * | 2/2003 | Lee | H01L 21/82380 257/200 |
| 2003/0168659 A1 | 9/2003 | Lal et al. | |
| 2003/0218189 A1 | 11/2003 | Christiansen et al. | |
| 2004/0004271 A1 * | 1/2004 | Fukuda | H01L 21/02381 257/616 |
| 2005/0003599 A1 * | 1/2005 | Yeo | H01L 21/76251 438/200 |
| 2005/0156246 A1 | 7/2005 | Langdo et al. | |
| 2007/0059875 A1 * | 3/2007 | Mishima | H01L 21/268 438/199 |

\* cited by examiner

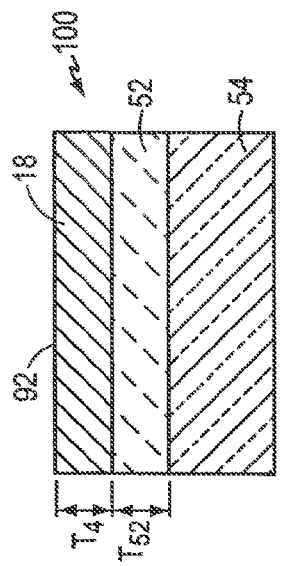
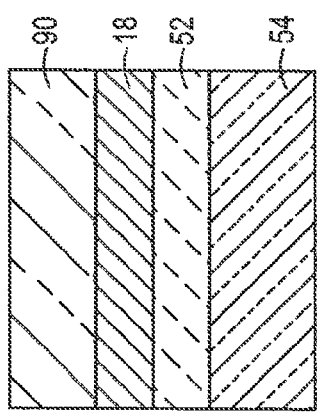
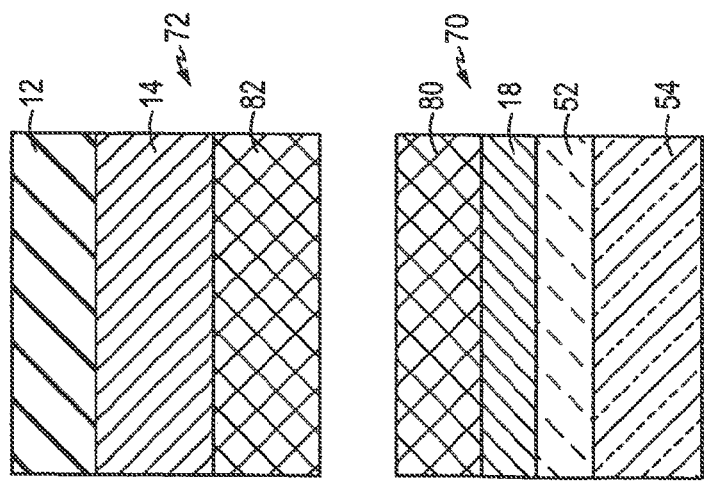
FIG. 6
FIG. 5
FIG. 4

METHODS OF FORMING STRAINED-SEMICONDUCTOR-ON-INSULATOR DEVICE STRUCTURES

This application is a divisional of, and claims priority to, U.S. patent application Ser. No. 11/073,780, filed on Mar. 7, 2005 and titled "Methods of Forming Strained-Semiconductor-on-Insulator Device Structures," which application is a divisional of U.S. patent application Ser. No. 10/264,935, filed Oct. 4, 2002 and titled "Strained-Semiconductor-on-Insulator Device Structures," which claims the benefit of U.S. Provisional Application Ser. No. 60/386,968 filed Jun. 7, 2002, titled "Strained Channel Devices with Resistance to Surface Roughness Scattering" and U.S. Provisional Application 60/404,058, filed Aug. 15, 2002 and titled "Strained-Silicon-on-Insulator Device Layers"; the entire disclosures of which all applications are hereby incorporated by reference.

TECHNICAL FIELD

This invention relates to devices and structures comprising strained semiconductor layers and insulator layers.

BACKGROUND

Strained silicon-on-insulator structures for semiconductor devices combine the benefits of two advanced approaches to performance enhancement: silicon-on-insulator (SOI) technology and strained silicon (Si) technology. The strained silicon-on-insulator configuration offers various advantages associated with the insulating substrate, such as reduced parasitic capacitances and improved isolation. Strained Si provides improved carrier mobilities. Devices such as strained Si metal-oxide-semiconductor field-effect transistors (MOSFETs) combine enhanced carrier mobilities with the advantages of insulating substrates.

Strained-silicon-on-insulator substrates are typically fabricated as follows. First, a relaxed silicon-germanium (SiGe) layer is formed on an insulator by one of several techniques such as separation by implantation of oxygen (SIMOX), wafer bonding and etch back; wafer bonding and hydrogen exfoliation layer transfer; or recrystallization of amorphous material. Then, a strained Si layer is epitaxially grown to form a strained-silicon-on-insulator structure, with strained Si disposed over SiGe. The relaxed-SiGe-on-insulator layer serves as the template for inducing strain in the Si layer. This induced strain is typically greater than $10^{-3}$.

This structure has limitations. It is not conducive to the production of fully-depleted strained-semiconductor-on-insulator devices in which the layer over the insulating material must be thin enough [<300 angstroms (angstroms)] to allow for full depletion of the layer during device operation. Fully depleted transistors may be the favored version of SOI for MOSFET technologies beyond the 90 nm technology node. The relaxed SiGe layer adds to the total thickness of this layer and thus makes it difficult to achieve the thicknesses required for fully depleted silicon-on-insulator device fabrication. The relaxed SiGe layer is not required if a strained Si layer can be produced directly on the insulating material. Thus, there is a need for a method to produce strained silicon—or other semiconductor—layers directly on insulating substrates.

BRIEF DESCRIPTION OF THE DRAWINGS

FIGS. 1A-6 are schematic cross-sectional views of substrates illustrating a method for fabricating an SSOI substrate;

Like-referenced features represent common features in corresponding drawings.

DETAILED DESCRIPTION OF ILLUSTRATIVE EMBODIMENTS

An SSOI structure may be formed by wafer bonding followed by cleaving. FIGS. 1A-2B illustrate formation of a suitable strained layer on a wafer for bonding, as further described below.

Figure 1A:
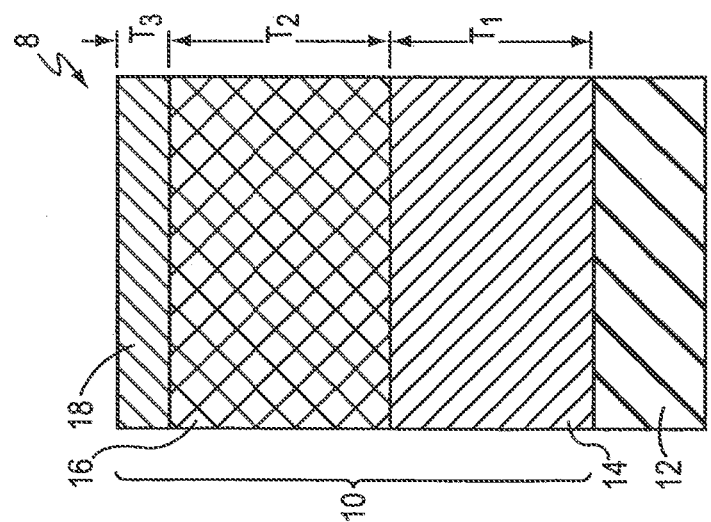

Referring to FIG. 1A, an epitaxial wafer 8 has a plurality of layers 10 disposed over a substrate 12. Substrate 12 may be formed of a semiconductor, such as Si, Ge, or SiGe. The plurality of layers 10 includes a graded buffer layer 14, which may be formed of $Si_{1-y}Ge_y$, with a maximum Ge content of, e.g., 20-70% (i.e., y=0.2-0.7) and a thickness T1 of, for example, 2-7 micrometers (μm). A relaxed layer 16 is disposed over graded buffer layer 14. Relaxed layer 16 may be formed of uniform $Si_{1-x}Ge_x$ having a Ge content of, for example, 20-70% (i.e., x=0.2-0.7), and a thickness T2 of, for example, 0.2-2 μm. In some embodiments, $Si_{1-x}Ge_x$ may include $Si_{0.70}Ge_{0.30}$ and $T_2$ may be approximately 1.5 μm. Relaxed layer 16 may be fully relaxed, as determined by triple axis X-ray diffraction, and may have a threading dislocation density of $<1*10^6$ cm$^{-2}$, as determined by etch pit density (EPD) analysis.

Substrate 12, graded layer 14, and relaxed layer 16 may be formed from various materials systems, including various combinations of group II, group III, group IV, group V, and group VI elements. For example, each of substrate 12, graded layer 14, and relaxed layer 16 may include a III-V compound. Substrate 12 may include gallium arsenide (GaAs), graded layer 14 and relaxed layer 16 may include indium gallium arsenide (InGaAs) or aluminum gallium arsenide (AlGaAs). These examples are merely illustrative, and many other material systems are suitable.

A strained semiconductor layer 18 is disposed over relaxed layer 16. Strained layer 18 may include a semiconductor such as at least one of a group II, a group III, a group IV, a group V, and a group VI element. Strained semiconductor layer 18 may include, for example, Si, Ge, SiGe, GaAs, indium phosphide (InP), and/or zinc selenide (ZnSe). Strained layer 18 has a thickness T3 of, for example, 50-1000 angstroms. In an embodiment, $T_3$ may be approximately 200-500 angstroms. Strained layer 18 may be formed by epitaxy, such as by atmospheric-pressure CVD (APCVD), low-(or reduced-) pressure CVD (LPCVD), ultra-high-vacuum CVD (UHVCVD), or by molecular beam epitaxy (MBE). The epitaxial growth system may be a single-wafer or multiple-wafer batch reactor. The growth system may also utilize a low-energy plasma to enhance layer growth kinetics. After formation, strained layer 18 has an initial misfit dislocation density, of, for example, 0-$10^5$ cm$^{-1}$. In one embodiment, strained layer 18 is tensilely strained. In another embodiment, strained layer 18 is compressively strained.

In alternative embodiments, graded layer 14 may be absent from the structure. Relaxed layer 16 may be formed in various ways, and the invention is not limited to embodiments having graded layer 14. In other embodiments, strained layer 18 may be formed directly on substrate 12. In this case, the strain in layer 18 may be induced by lattice mismatch between layer 18 and substrate 12, induced mechanically, e.g., by the deposition of overlayers, such as $Si_3N_4$, or induced by thermal mismatch between layer 18 and a subsequently grown layer, such as a SiGe layer. In some embodiments, a uniform semiconductor layer (not shown), having a thickness of approximately 0.5 μm and comprising the same semiconductor material as substrate 12, is disposed between graded buffer layer 14 and substrate 12. This uniform semiconductor layer may be grown to improve the material quality of layers subsequently grown on substrate 12, such as graded buffer layer 14, by providing a clean, contaminant-free surface for epitaxial growth. In certain embodiments, relaxed layer 16 may be planarized prior to growth of strained layer 18 to eliminate the crosshatched surface roughness induced by graded buffer layer 14. (See, e.g., M. T. Currie, et al., Appl. Phys. Lett., 72 (14) p. 1718 (1998), incorporated herein by reference.) The planarization may be performed by a method such as chemical mechanical polishing (CMP), and may improve the quality of a subsequent bonding process (see below) because it minimizes the wafer surface roughness and increases wafer flatness, thus providing a greater surface area for bonding.

Figure 1B:
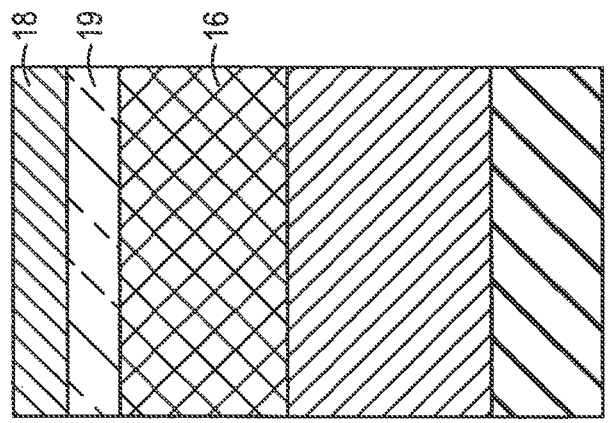

Referring to FIG. 1B, after planarization of relaxed layer 16, a relaxed semiconductor regrowth layer 19 including a semiconductor such as SiGe may be grown on relaxed layer 16, thus improving the quality of subsequent strained layer 18 growth by ensuring a clean surface for the growth of strained layer 18. Growing on this clean surface may be preferable to growing strained material, e.g., silicon, on a surface that is possibly contaminated by oxygen and carbon from the planarization process. The conditions for epitaxy of the relaxed semiconductor regrowth layer 19 on the planarized relaxed layer 16 should be chosen such that surface roughness of the resulting structure, including layers formed over regrowth layer 19, is minimized to ensure a surface suitable for subsequent high quality bonding. High quality bonding may be defined as the existence of a bond between two wafers that is substantially free of bubbles or voids at the interface. Measures that may help ensure a smooth surface for strained layer 18 growth, thereby facilitating bonding, include substantially matching a lattice of the semiconductor regrowth layer 19 to that of the underlying relaxed layer 16, by keeping the regrowth thickness below approximately 1 μm, and/or by keeping the growth temperature below approximately 850° C. for at least a portion of the semiconductor layer 19 growth. It may also be advantageous for relaxed layer 16 to be substantially free of particles or areas with high threading dislocation densities (i.e., threading dislocation pile-ups) which could induce non-planarity in the regrowth and decrease the quality of the subsequent bond Referring to FIG. 2A, in an embodiment, hydrogen ions are implanted into relaxed layer 16 to define a cleave plane 20. This implantation is similar to the SMARTCUT process that has been demonstrated in silicon by, e.g., SOITEC, based in Grenoble, France. Implantation parameters may include implantation of hydrogen ($H_2^+$) to a dose of 3-5*$10^{16}$/cm$^2$ at an energy of, e.g., 50-100 keV. For example, $H_2^+$ may be implanted at an energy of 75 keV and a dose of 4*$10^{16}$/cm$^2$ through strained layer 18 into relaxed layer 16. In alternative embodiments, it may be favorable to implant at energies less than 50 keV to decrease the depth of cleave plane 20 and decrease the amount of material subsequently removed during the cleaving process (see discussion below with reference to FIG. 4). In an alternative embodiment, other implanted species may be used, such as $H^+$ or $He^+$, with the dose and energy being adjusted accordingly. The implantation may also be performed prior to the formation of strained layer 18. Then, the subsequent growth of strained layer 18 is preferably performed at a temperature low enough to prevent premature cleaving along cleave plane 20, i.e., prior to the wafer bonding process. This cleaving temperature is a complex function of the implanted species, implanted dose, and implanted material. Typically, premature cleaving may be avoided by maintaining a growth temperature below approximately 500° C.

Figure 2B:
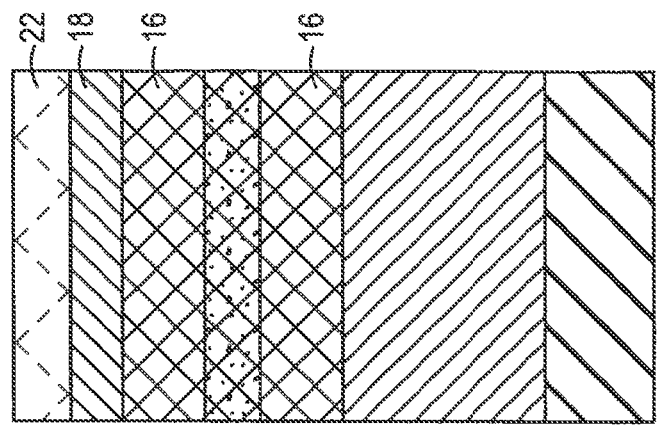
Figure 2A:
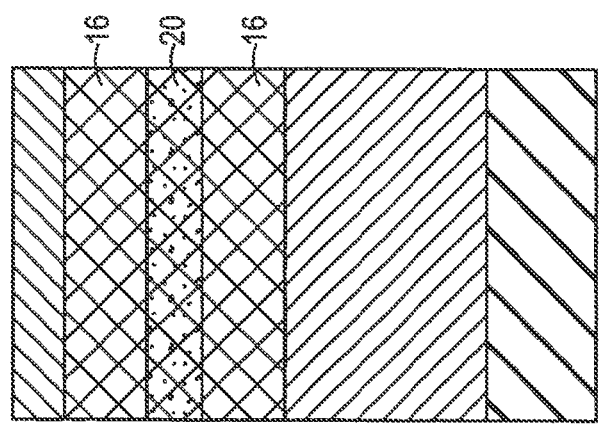

In some embodiments, strained layer 18 may be planarized by, e.g., CMP, to improve the quality of the subsequent bond. Referring to FIG. 2B, in some embodiments, a dielectric layer 22 may be formed over strained layer 18 prior to ion implantation into relaxed layer 16 to improve the quality of the subsequent bond. Dielectric layer 22 may be, e.g., silicon dioxide ($SiO_2$) deposited by, for example, LPCVD or by high density plasma (HDP). An LPCVD deposited $SiO_2$ layer may be subjected to a densification step at elevated temperature. Suitable conditions for this densification step can be a 10 minute anneal at 800° C. in a nitrogen ambient. Dielectric layer 22 may be planarized by, e.g., CMP to improve the quality of the subsequent bond. In an alternative embodiment, it may be advantageous for dielectric layer 22 to be formed from thermally grown $SiO_2$ in order to provide a high quality semiconductor/dielectric interface in the final structure.

Figure 3:
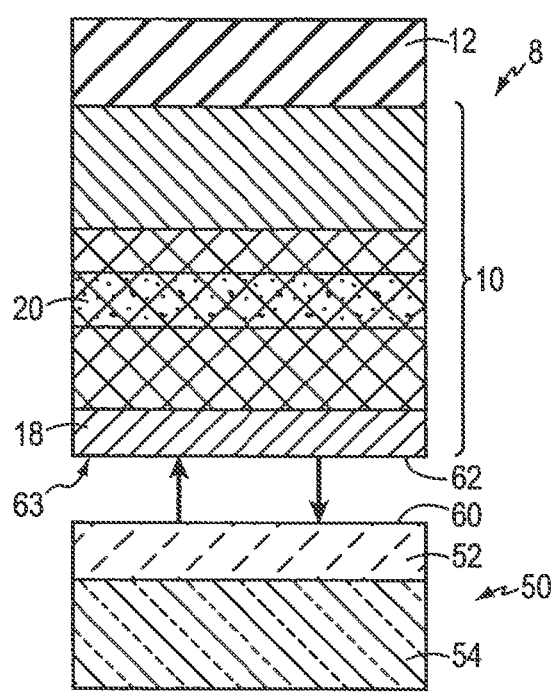

Referring to FIG. 3, epitaxial wafer 8 is bonded to a handle wafer 50. Either handle wafer 50, epitaxial wafer 8, or both have a top dielectric layer (see, e.g., dielectric layer 22 in FIG. 2B) to facilitate the bonding process and to serve as an insulator layer in the final substrate structure. Handle wafer 50 may have a dielectric layer 52 disposed over a semiconductor substrate 54. Dielectric layer 52 may include, for example, $SiO_2$, silicon nitride ($Si_3N_4$), aluminum oxide, etc. In other embodiments, handle wafer 50 may comprise a combination of a bulk semiconductor material and a dielectric layer, such as a silicon on insulator substrate. Semiconductor substrate 54 includes a semiconductor material such as, for example, Si, Ge, or SiGe. Handle wafer 50 and epitaxial wafer 8 are cleaned by a wet chemical cleaning procedure to facilitate bonding, such as by a hydrophilic surface preparation process to assist the bonding of a semiconductor material, e.g., strained layer 18, to a dielectric material, e.g., dielectric layer 52. For example, a suitable prebonding surface preparation cleaning procedure could include a modified megasonic RCA SC1 clean containing ammonium hydroxide, hydrogen peroxide, and water ($NH_4OH:H_2O_2:H_2O$) at a ratio of 1:4:20 at 60° C. for 10 minutes, followed by a deionized (DI) water rinse and spin dry. The wafer bonding energy should be strong enough to sustain the subsequent layer transfer (see FIG. 4). In some embodiments, top surfaces 60, 62 of handle wafer 50 and epitaxial wafer 8, including a top surface 63 of strained semiconductor layer 18, may be subjected to a plasma activation, either before, after, or instead of a wet clean, to increase the bond strength. The plasma environment may include at least one of the following species: oxygen, ammonia, argon, and nitrogen. After an appropriate cleaning step, handle wafer 50 and epitaxial wafer 8 are bonded together by bringing top surfaces 60, 62 in contact with each other at room temperature. The bond strength may be greater than 1000 mJ/m$^2$, achieved at a low temperature, such as less than 600° C.

Referring to FIG. 4 as well as to FIG. 3, a split is induced at cleave plane 20 by annealing handle wafer 50 and epitaxial wafer 8 after they are bonded together. This split may be induced by an anneal at 300-700° C., e.g., 550° C., inducing hydrogen exfoliation layer transfer (i.e., along cleave plane 20) and resulting in the formation of two separate wafers 70, 72. One of these wafers (70) has a first portion 80 of relaxed layer 16 (see FIG. 1A) disposed over strained layer 18. Strained layer 18 is in contact with dielectric layer 52 on semiconductor substrate 54. The other of these wafers (72) includes silicon substrate 12, graded layer 14, and a remaining portion 82 of relaxed layer 16. If necessary, wafer 70 with strained layer 18 may be annealed further at 600-900° C., e.g., at a temperature greater than 800° C., to strengthen the bond between the strained layer 18 and dielectric layer 52. In some embodiments, this anneal is limited to an upper temperature of about 900° C. to avoid the destruction of a strained Si/relaxed SiGe heterojunction by diffusion. Wafer 72 may be planarized, and used as starting substrate 8 for growth of another strained layer 18. In this manner, wafer 72 may be "recycled" and the process illustrated in FIGS. 1A-5 may be repeated.

Referring to FIG. 4 as well as to FIG. 5, relaxed layer portion 80 is removed from strained layer 18. Relaxed layer portion 80, including, e.g., SiGe, is oxidized by wet (steam) oxidation. For example, at temperatures below approximately 800° C., such as temperatures between 600-750° C., wet oxidation will oxidize SiGe much more rapidly than Si, such that the oxidation front will effectively stop when it reaches the strained layer 18, in embodiments in which strained layer 18 includes Si. The difference between wet oxidation rates of SiGe and Si may be even greater at lower temperatures, such as approximately 400° C.-600° C. Good oxidation selectivity is provided by this difference in oxidation rates, i.e., SiGe may be efficiently removed at low temperatures with oxidation stopping when strained layer 18 is reached. This wet oxidation results in the transformation of SiGe to a thermal insulator 90, e.g., $Si_xGe_yO_z$. The thermal insulator 90 resulting from this oxidation is removed in a selective wet or dry etch, e.g., wet hydrofluoric acid. In some embodiments, it may be more economical to oxidize and strip several times, instead of just once.

In certain embodiments, wet oxidation may not completely remove the relaxed layer portion 80. Here, a localized rejection of Ge may occur during oxidation, resulting in the presence of a residual Ge-rich SiGe region at the oxidation front, on the order of, for example, several nanometers in lateral extent. A surface clean may be performed to remove this residual Ge. For example, the residual Ge may be removed by a dry oxidation at, e.g., 600° C., after the wet oxidation and strip described above. Another wet clean may be performed in conjunction with—or instead of—the dry oxidation. Examples of possible wet etches for removing residual Ge include a Piranha etch, i.e., a wet etch that is a mixture of sulfuric acid and hydrogen peroxide ($H_2SO_4$: $H_2O_2$) at a ratio of 3:1. An HF dip may be performed after the Piranha etch. Alternatively, an RCA SC1 clean may be used to remove the residual Ge. The process of Piranha or RCA SC1 etching and HF removal of resulting oxide may be repeated more than once.

In an embodiment, after cleaving and prior to removal of relaxed layer portion 80 by, e.g., wet oxidation, a CMP step may be performed to remove part of relaxed layer portion 80 as well as to increase the smoothness of its surface. A smoother surface will improve the uniformity of subsequent complete removal by, e.g., wet oxidation.

After removal of relaxed layer portion 80, strained layer 18 may be planarized. Planarization of strained layer 18 may be performed by, e.g., CMP or an anneal at a temperature greater than, for example, 800° C.

Referring to FIG. 6, a SSOI substrate 100 has strained layer 18 disposed over an insulator, such as dielectric layer 52 formed on semiconductor substrate 54. Strained layer 18 has a thickness T4 selected from a range of, for example, 20-1000 angstroms, with a thickness uniformity of better than approximately .+−.5% and a surface roughness of less than approximately 20 angstroms. Dielectric layer 52 has a thickness T52 selected from a range of, for example, 500-3000 angstroms. In an embodiment, the misfit dislocation density of strained layer 18 may be lower than its initial dislocation density. The initial dislocation density may be lowered by, for example, performing an etch of a top surface 92 of strained layer 18. This etch may be a wet etch, such as a standard microelectronics clean step such as an RCA SC1, i.e., hydrogen peroxide, ammonium hydroxide, and water ($H_2O_2$+$NH_4OH$+$H_2O$), which at, e.g., 80° C. may remove silicon. In some embodiments, strained semiconductor layer 18 includes Si and is substantially free of Ge; further, any other layer disposed in contact with strained semiconductor layer 18, e.g., dielectric layer 52, is also substantially free of Ge.

Figure 7:
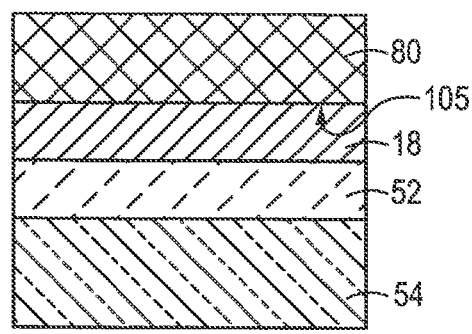
FIG. 7 is a schematic cross-sectional view illustrating an alternative method for fabricating the SSOI substrate illustrated in FIG. 6.

Referring to FIG. 7, in an alternative embodiment, relaxed layer portion 80 may be removed by a selective wet etch which stops at the strained layer 18 to obtain SSOI substrate 100 (see FIG. 6). In embodiments in which relaxed layer portion 80 contains SiGe, a suitable selective SiGe wet etch may be a mixture of hydrofluoric acid, hydrogen peroxide, and acetic acid (HF:$H_2O_2$:$CH_3COOH$), at a ratio of 1:2:3. Alternatively, relaxed layer portion 80 may be removed by a dry etch which stops at strained layer 18. In some embodiments, relaxed layer portion 80 may be removed completely or in part by a chemical-mechanical polishing step or by mechanical grinding.

Figure 8:
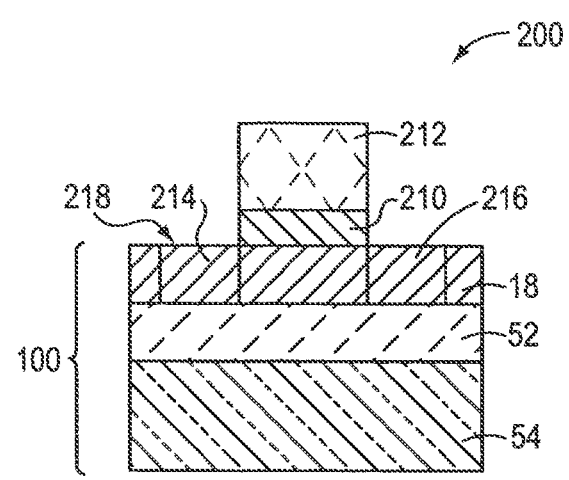
FIG. 8 is a schematic cross-sectional view of a transistor formed on the SSOI substrate illustrated in FIG. 6.

Strained semiconductor-on-insulator substrate 100 may be further processed by CMOS SOI MOSFET fabrication methods. For example, referring to FIG. 8, a transistor 200 may be formed on SSOI substrate 100. Forming transistor 200 includes forming a gate dielectric layer 210 above strained layer 18 by, for example, growing an $SiO_2$ layer by thermal oxidation. Alternatively, gate dielectric layer 210 may include a high-k material with a dielectric constant higher than that of $SiO_2$, such as hafnium oxide ($HfO_2$) or hafnium silicate (HfSiON, $HfSiO_4$). In some embodiments, gate dielectric layer 210 may be a stacked structure, e.g., a thin $SiO_2$ layer capped with a high-k material. A gate 212 is formed over gate dielectric layer 210. Gate 212 may be formed of a conductive material, such as doped semiconductor, e.g., polycrystalline Si or polycrystalline SiGe, or a metal. A source region 214 and a drain region 216 are formed in a portion 218 of strained semiconductor layer 18, proximate gate dielectric layer 210. Source and drain regions 214, 216 may be formed by, e.g., ion implantation of either n-type or p-type dopants.

Figure 9:
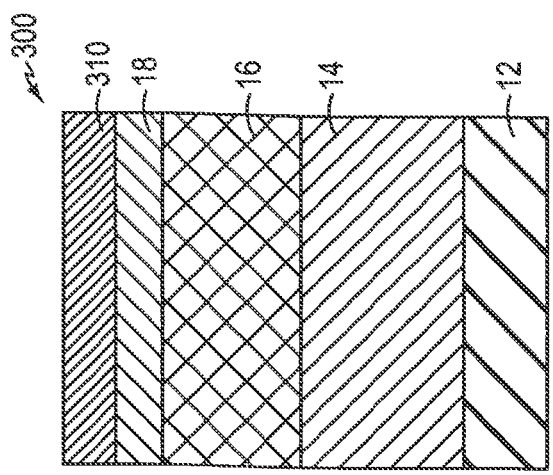

In alternative embodiments, an SSOI structure may include, instead of a single strained layer, a plurality of semiconductor layers disposed on an insulator layer. For example, referring to FIG. 9, epitaxial wafer 300 includes strained layer 18, relaxed layer 16, graded layer 14, and substrate 12. In addition, a semiconductor layer 310 is disposed over strained layer 18. Strained layer 18 may be tensilely strained and semiconductor layer 310 may be compressively strained. In an alternative embodiment, strained layer 18 may be compressively strained and semiconductor layer 310 may be tensilely strained. Strain may be induced by lattice mismatch with respect to an adjacent layer, as described above, or mechanically. For example, strain may be induced by the deposition of overlayers, such as $Si_3N_4$. In another embodiment, semiconductor layer 310 is relaxed. Semiconductor layer 310 includes a semiconductor material, such as at least one of a group II, a group III, a group IV, a group V, and a group VI element. Epitaxial wafer 300 is processed in a manner analogous to the processing of epitaxial wafer 8, as described with reference to FIGS. 1-7.

Figure 10:
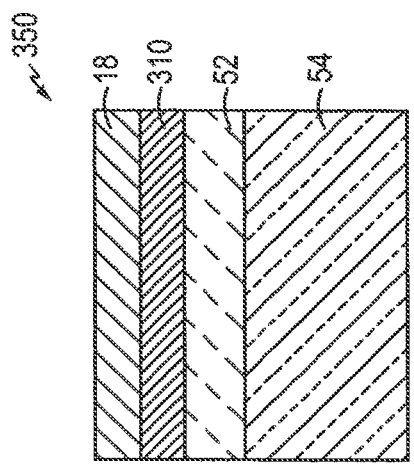
FIGS. 9-10 are schematic cross-sectional views of substrate(s) illustrating a method for fabricating an alternative SSOI substrate.

Referring also to FIG. 10, processing of epitaxial wafer 300 results in the formation of SSOI substrate 350, having strained layer 18 disposed over semiconductor layer 310. Semiconductor layer 310 is bonded to dielectric layer 52, disposed over substrate 54. As noted above with reference to FIG. 9, strained layer 18 may be tensilely strained and semiconductor layer 310 may be compressively strained. Alternatively, strained layer 18 may be compressively strained and semiconductor layer 310 may be tensilely strained. In some embodiments, semiconductor layer 310 may be relaxed.

Figure 11:
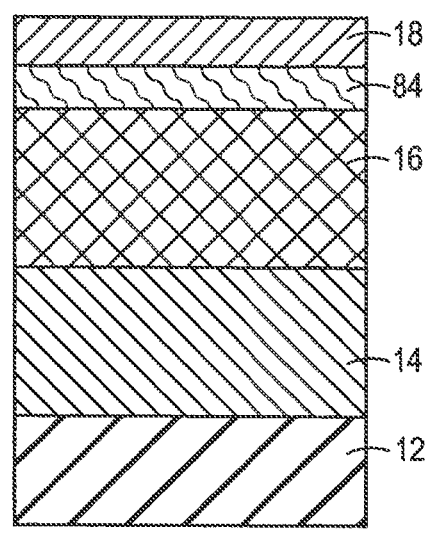
FIG. 11 is a schematic cross-sectional view of a substrate having several layers formed thereon.

Referring to FIG. 11, in some embodiments, a thin strained layer 84 may be grown between strained layer 18 and relaxed layer 16 to act as an etch stop during etching, such as wet etching. In an embodiment in which strained layer 18 includes Si and relaxed layer 16 includes $Si_{1-y}Ge_y$, thin strained layer 84 may include $Si_{1-x}Ge_x$, with a higher Ge content (x) than the Ge content (y) of relaxed layer 16, and hence be compressively strained. For example, if the composition of the relaxed layer 16 is 20% Ge ($Si_{0.80}Ge_{0.20}$), thin strained layer 84 may contain 40% Ge ($Si_{0.60}Ge_{0.40}$) to provide a more robust etch stop. In other embodiments, a second strained layer, such as thin strained layer 84 with higher Ge content than relaxed layer 16, may act as a preferential cleave plane in the hydrogen exfoliation/cleaving procedure described above.

In an alternative embodiment, thin strained layer 84 may contain $Si_{1-x}Ge_x$ with lower Ge content than relaxed layer 16. In this embodiment, thin strained layer 84 may act as a diffusion barrier during the wet oxidation process. For example, if the composition of relaxed layer 16 is 20% Ge ($Si_{0.80}Ge_{0.20}$), thin strained layer 84 may contain 10% Ge ($Si_{0.90}Ge_{0.10}$) to provide a barrier to Ge diffusion from the higher Ge content relaxed layer 16 during the oxidation process. In another embodiment, thin strained layer 84 may be replaced with a thin graded $Si_{1-z}Ge_z$ layer in which the Ge composition (z) of the graded layer is decreased from relaxed layer 16 to the strained layer 18.

Referring again to FIG. 7, in some embodiments, a small amount, e.g., approximately 20-100 angstroms, of strained layer 18 may be removed at an interface 105 between strained layer 18 and relaxed layer portion 80. This may be achieved by overetching after relaxed layer portion 80 is removed. Alternatively, this removal of strained layer 18 may be performed by a standard microelectronics clean step such as an RCA SC1, i.e., hydrogen peroxide, ammonium hydroxide, and water ($H_2O_2+NH_4OH+H_2O$), which at, e.g., 80° C. may remove silicon. This silicon removal may remove any misfit dislocations that formed at the original strained layer 18/relaxed layer 80 interface 105 if strained layer 18 was grown above the critical thickness. The critical thickness may be defined as the thickness of strained layer 18 beyond which it becomes energetically favorable for the strain in the layer to partially relax via the introduction of misfit dislocations at interface 105 between strained layer 18 and relaxed layer 16. Thus, the method illustrated in FIGS. 1-7 provides a technique for obtaining strained layers above a critical thickness without misfit dislocations that may compromise the performance of deeply scaled MOSFET devices.

Figure 12:
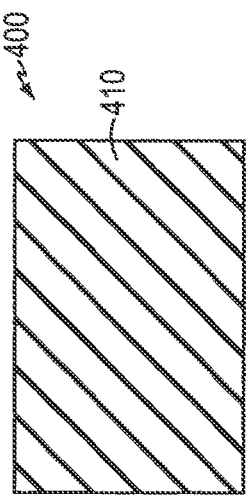

Referring to FIG. 12, in some embodiments, handle wafer 50 may have a structure other than a dielectric layer 52 disposed over a semiconductor substrate 54. For example, a bulk relaxed substrate 400 may comprise a bulk material 410 such as a semiconductor material, e.g., bulk silicon. Alternatively, bulk material 410 may be a bulk dielectric material, such as $Al_2O_3$ (e.g., alumina or sapphire) or $SiO_2$ (e.g., quartz). Epitaxial wafer 8 may then be bonded to handle wafer 400 (as described above with reference to FIGS. 1-6), with strained layer 18 being bonded to the bulk material 410 comprising handle wafer 400. In embodiments in which bulk material 410 is a semiconductor, to facilitate this semiconductor-semiconductor bond, a hydrophobic clean may be performed, such as an HF dip after an RCA SC1 clean.

Figure 13:
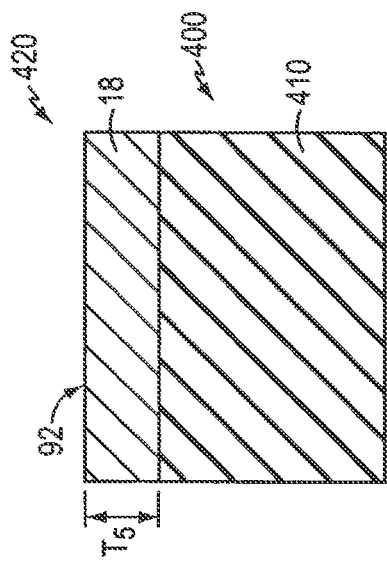
FIGS. 12-13 are schematic cross-sectional views of substrates illustrating a method for fabricating an alternative strained semiconductor substrate.
Figure 14:
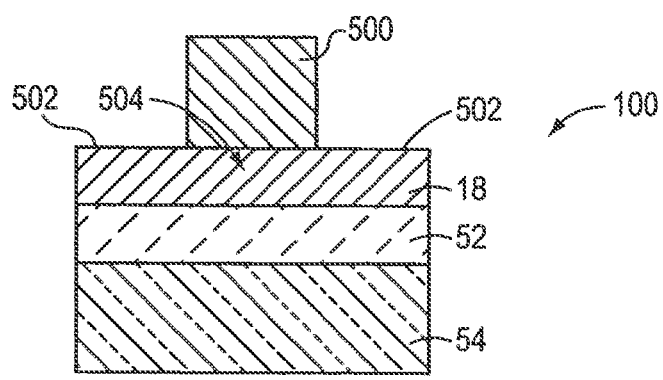
FIG. 14 is a schematic cross-sectional view of the SSOI substrate illustrated in FIG. 6 after additional processing.

Referring to FIG. 13, after bonding and further processing (as described above), a strained-semiconductor-on-semiconductor (SSOS) substrate 420 is formed, having strained layer 18 disposed in contact with relaxed substrate 400. The strain of strained layer 18 is not induced by underlying relaxed substrate 400, and is independent of any lattice mismatch between strained layer 18 and relaxed substrate 400. In an embodiment, strained layer 18 and relaxed substrate 400 include the same semiconductor material, e.g., silicon. Relaxed substrate 400 may have a lattice constant equal to a lattice constant of strained layer 18 in the absence of strain. Strained layer 18 may have a strain greater than approximately $1*10^{-3}$. Strained layer 18 may have been formed by epitaxy, and may have a thickness T5 of between approximately 20 angstroms-1000 angstroms, with a thickness uniformity of better than approximately .+−.5%. Surface 92 of strained layer 18 may have a surface roughness of less than 20 angstroms Referring to FIG. 14, in an embodiment, after fabrication of the SSOI structure 100 including semiconductor substrate 54 and dielectric layer 52, it may be favorable to selectively relax the strain in at least a portion of strained layer 18. This could be accomplished by introducing a plurality of ions by, e.g., ion implantation after a photolithography step in which at least a portion of the structure is masked by, for example, a photoresist feature 500. Ion implantation parameters may be, for example, an implant of Si ions at a dose of $1*10^{15}$-$1*10^{17}$ ions-$cm^{-2}$, at an energy of 5-75 keV. After ion implantation, a relaxed portion 502 of strained layer 18 is relaxed, while a strained portion 504 of strained layer 18 remains strained.

The bonding of strained silicon layer 18 to dielectric layer 52 has been experimentally demonstrated. For example, strained layer 18 having a thickness of 54 nanometers (nm) along with .about.350 nm of $Si_{0.70}Ge_{0.30}$ have been transferred by hydrogen exfoliation to Si handle wafer 50 having dielectric layer 52 formed from thermal $SiO_2$ with a thickness of approximately 100 nm. The implant conditions were $4*10^{16}/cm^3 H_2^+$ dose at 75 keV. The anneal procedure was 1 hour at 550° C. to split the SiGe layer, followed by a 1 hour, 800° C. strengthening anneal. The integrity of strained Si layer 18 and good bonding to dielectric layer 52 after layer transfer and anneal were confirmed with cross-sectional transmission electron microscopy (XTEM). An SSOI structure 100 was characterized by XTEM and analyzed via Raman spectroscopy to determine the strain level of the transferred strained Si layer 18. An XTEM image of the transferred intermediate SiGe/strained Si/SiO$_2$ structure showed transfer of the 54 nm strained Si layer 18 and .about.350 nm of the Si$_{0.70}$Ge$_{0.30}$ relaxed layer 16. Strained Si layer 18 had a good integrity and bonded well to SiO$_2$ 54 layer after the annealing process.

XTEM micrographs confirmed the complete removal of relaxed SiGe layer 16 after oxidation and HF etching. The final structure includes strained Si layer 18 having a thickness of 49 nm on dielectric layer 52 including SiO$_2$ and having a thickness of 100 nm.

Raman spectroscopy data enabled a comparison of the bonded and cleaved structure before and after SiGe layer 16 removal. Based on peak positions the composition of the relaxed SiGe layer and strain in the Si layer may be calculated. See, for example, J. C. Tsang, et al., J. Appl. Phys. 75 (12) p. 8098 (1994), incorporated herein by reference. The fabricated SSOI structure 100 had a clear strained Si peak visible at .about.511 cm$^{-1}$. Thus, the SSOI structure 100 maintained greater than 1% tensile strain in the absence of the relaxed SiGe layer 16. In addition, the absence of Ge—Ge, Si—Ge, and Si—Si relaxed SiGe Raman peaks in the SSOI structure confirmed the complete removal of SiGe layer 16.

In addition, the thermal stability of the strained Si layer was evaluated after a 3 minute 1000° C. rapid thermal anneal (RTA) to simulate an aggregate thermal budget of a CMOS process. A Raman spectroscopy comparison was made of SSOI structure 100 as processed and after the RTA step. A scan of the as-bonded and cleaved sample prior to SiGe layer removal was used for comparison. Throughout the SSOI structure 100 fabrication process and subsequent anneal, the strained Si peak was visible and the peak position did not shift. Thus, the strain in SSOI structure 100 was stable and was not diminished by thermal processing. Furthermore, bubbles or flaking of the strained Si surface 18 were not observed by Nomarski optical microscopy after the RTA, indicating good mechanical stability of SSOI structure 100.

The present invention includes a strained-semiconductor-on-insulator (SSOI) substrate structure and methods for fabricating the substrate structure. MOSFETs fabricated on this substrate will have the benefits of SOI MOSFETs as well as the benefits of strained Si mobility enhancement. By eliminating the SiGe relaxed layer traditionally found beneath the strained Si layer, the use of SSOI technology is simplified. For example, issues such as the diffusion of Ge into the strained Si layer during high temperature processes are avoided.

This approach enables the fabrication of well-controlled, epitaxially-defined, thin strained semiconductor layers directly on an insulator layer. Tensile strain levels of .about.1% or greater are possible in these structures, and are not diminished after thermal anneal cycles. In some embodiments, the strain-inducing relaxed layer is not present in the final structure, eliminating some of the key problems inherent to current strained Si-on-insulator solutions. This fabrication process is suitable for the production of enhanced-mobility substrates applicable to partially or fully depleted SSOI technology.

In an aspect, the invention features a structure that includes a first substrate having a dielectric layer disposed thereon, and a first strained semiconductor layer disposed in contact with the dielectric layer.

One or more of the following features may be included. The strained semiconductor layer may include at least one of a group II, a group III, a group IV, a group V, and a group VI element, such as silicon, germanium, silicon germanium, gallium arsenide, indium phosphide, or zinc selenide. The strained semiconductor layer may be substantially free of germanium, and any other layer disposed in contact with the strained semiconductor layer may be substantially free of germanium. The strained semiconductor layer may be tensilely strained or compressively strained. The strained semiconductor layer may have a strained portion and a relaxed portion.

A second strained semiconductor layer may be in contact with the first strained semiconductor layer. The first strained semiconductor layer may be compressively strained and the second strained semiconductor layer may be tensilely strained, or vice versa.

The structure may include a transistor having a source region and a drain region disposed in a portion of the strained semiconductor layer, a gate disposed above the strained semiconductor layer and between the source and drain regions, and a gate dielectric layer disposed between the gate and the strained semiconductor layer.

The strained semiconductor layer may have been formed on a second substrate, may have been disposed in contact with the dielectric layer by bonding, and may have a lower dislocation density than an initial dislocation density of the strained semiconductor layer as formed. The initial dislocation density may have been lowered by etching. The strained semiconductor layer may have been grown with an initial dislocation density and may have a dislocation density less than the initial dislocation density. The strained semiconductor layer may have been formed by epitaxy. The strained semiconductor layer may have a thickness uniformity of better than approximately .+-.5%. The strained layer has a thickness selected from a range of approximately 20 angstroms-1000 angstroms. The strained layer has a surface roughness of less than approximately 20 angstroms. The substrate may include silicon and/or germanium.

In another aspect, the invention features a structure including a relaxed substrate including a bulk material, and a strained layer disposed in contact with the relaxed substrate. The strain of the strained layer is not induced by the underlying substrate, and the strain is independent of a lattice mismatch between the strained layer and the relaxed substrate. The bulk material may include a first semiconductor material. The strained layer may include a second semiconductor material. The first semiconductor material may be essentially the same as the second semiconductor material. The first and second semiconductor material may include silicon. A lattice constant of the relaxed substrate may be equal to a lattice constant of the strained layer in the absence of strain. The strain of the strained layer may be greater than approximately $1*10^{-3}$. The strained layer may have been formed by epitaxy. The strained layer may have a thickness uniformity of better than approximately .+-.5%. The strained layer may have a thickness selected from a range of approximately 20 angstroms-1000 angstroms. The strained layer may have a surface roughness of less than approximately 20 angstroms.

The structure may include a transistor having a source region and a drain region disposed in a portion of the strained semiconductor layer, a gate contact disposed above the strained semiconductor layer and between the source and drain regions, and a gate dielectric layer disposed between the gate contact and the strained semiconductor layer.

In another aspect, the invention features a structure including a substrate including a dielectric material, and a strained semiconductor layer disposed in contact with the dielectric material.

One or more of the following features may be included. The dielectric material may include sapphire. The semiconductor layer may have been formed on a second substrate, have been disposed in contact with the dielectric material by bonding, and have a lower dislocation density than an initial dislocation density of the semiconductor layer as formed. The initial dislocation density may have been lowered by etching. The semiconductor layer may have been formed by epitaxy.

In another aspect, the invention features a method for forming a structure, the method including providing a first substrate having a first strained semiconductor layer formed thereon, bonding the first strained semiconductor layer to an insulator layer disposed on a second substrate and, removing the first substrate from the first strained semiconductor layer, the strained semiconductor layer remaining bonded to the insulator layer.

One or more of the following features may be included. The strained semiconductor layer may be tensilely or compressively strained. The strained semiconductor layer may include a surface layer or a buried layer after the removal of the first substrate.

Removing the first substrate from the strained semiconductor layer may include cleaving. Cleaving may include implantation of an exfoliation species through the strained semiconductor layer to initiate cleaving. The exfoliation species may include at least one of hydrogen and helium. Providing the first substrate may include providing the first substrate having a second strained layer disposed between the substrate and the first strained layer, the second strained layer acting as a cleave plane during cleaving. The second strained layer may include a compressively strained layer. The compressively strained layer may include $Si_{1-x}Ge_x$. The first substrate may have a relaxed layer disposed between the substrate and the first strained layer.

The relaxed layer may be planarized prior to forming the first strained semiconductor layer. After the relaxed layer is planarized, a relaxed semiconductor regrowth layer may be formed thereon. A dielectric layer may be formed over the first strained semiconductor layer prior to bonding the first strained semiconductor layer to an insulator layer. Removing the first substrate from the strained semiconductor layer may include mechanical grinding. Bonding may include achieving a high bond strength, e.g., greater than or equal to about 1000 milliJoules/meter squared ($mJ/m^2$), at a low temperature, e.g., less than approximately 600° C.

Bonding may include plasma activation of a surface of the first semiconductor layer prior to bonding the first semiconductor layer. Plasma activation may include use of at least one of an ammonia ($NH_3$), an oxygen ($O_2$), an argon (Ar), and a nitrogen ($N_2$) source gas. Bonding may include planarizing a surface of the first semiconductor layer prior to bonding the first semiconductor layer by, e.g., chemical-mechanical polishing. A portion of the first strained semiconductor layer may be relaxed such as by, e.g., introducing a plurality of ions into the portion of the first strained semiconductor layer.

A transistor may be formed by forming a gate dielectric layer above a portion of the strained semiconductor layer, forming a gate contact above the gate dielectric layer, and forming a source region and a drain region in a portion of the strained semiconductor layer, proximate the gate dielectric layer.

In another aspect, the invention features a method for forming a structure, the method including providing a substrate having a relaxed layer disposed over a first strained layer, the relaxed layer inducing strain in the first strained layer, and removing at least a portion of the relaxed layer selectively with respect to the first strained layer.

One or more of the following features may be included. The first strained layer may be bonded to the substrate, including, e.g., to an insulator layer disposed on the substrate. The first strained layer may be formed over the relaxed layer on another substrate. The portion of the relaxed layer may be removed by, e.g., oxidation, a wet chemical etch, a dry etch, and/or chemical-mechanical polishing. After removal of at least a portion of the relaxed layer, the strained layer may be planarized by, e.g., chemical-mechanical polishing and/or an anneal. The anneal may be performed at a temperature greater than 800° C.

The substrate may have an etch stop layer disposed between the relaxed layer and the strained layer. The etch stop layer may be compressively strained. The strained layer may include silicon, the relaxed layer may include silicon germanium, and the etch stop layer may include silicon germanium carbon. The relaxed layer may include $Si_{1-y}Ge_y$, the etch stop layer may include $Si_{1-x}Ge_x$ and x may be greater than y, e.g., x may be approximately 0.5 and y may be approximately 0.2. The etch stop layer enables an etch selectivity to the relaxed layer of greater than 10:1, e.g., greater than 100:1. The etch stop layer may have a thickness selected from a range of about 20 angstroms to about 1000 angstroms. The relaxed layer may be formed over a graded layer.

In another aspect, the invention features a method for forming a structure, the method including providing a first substrate having a dielectric layer disposed thereon, and forming a semiconductor layer on a second substrate, the semiconductor layer having an initial misfit dislocation density. The semiconductor layer is bonded to the dielectric layer, and the second substrate is removed, the semiconductor layer remaining bonded to the dielectric layer. The misfit dislocation density in the semiconductor layer is reduced.

One or more of the following features may be included. The misfit dislocation density may be reduced by removing a portion of the semiconductor layer, such as, e.g., by etching. After removing a portion of the semiconductor layer to reduce misfit dislocation density, a regrowth layer may be formed over the semiconductor layer without increasing misfit dislocation density. The regrowth layer may be formed by epitaxy.

In another aspect, the invention features a method for forming a structure, the method including providing a first substrate having a dielectric layer disposed thereon, forming a semiconductor layer on a second substrate, the semiconductor layer having an initial misfit dislocation density. The semiconductor layer is bonded to the dielectric layer. The second substrate is removed, the semiconductor layer remaining bonded to the dielectric layer, and a regrowth layer is grown over the semiconductor layer.

One or more of the following features may be included. The semiconductor layer and the regrowth layer may include the same semiconductor material. The semiconductor layer and the regrowth layer together may have a misfit dislocation density not greater than the initial misfit dislocation density.

In another aspect, the invention features a method for forming a structure, the method including providing a first substrate having a strained layer disposed thereon, the strained layer including a first semiconductor material, and bonding the strained layer to a second substrate, the second substrate including a bulk material. The first substrate is removed from the strained layer, the strained layer remaining bonded to the bulk semiconductor material. The strain of the strained layer is not induced by the second substrate and the strain is independent of lattice mismatch between the strained layer and the second substrate.

One or more of the following features may be included. The bulk material may include a second semiconductor material. The first semiconductor material may be substantially the same as the second semiconductor material. The second substrate and/or the strained semiconductor layer may include silicon.

In another aspect, the invention features a method for forming a structure, the method including providing a first substrate having a semiconductor layer disposed over a strained layer. The semiconductor layer is bonded to an insulator layer disposed on a second substrate, and the first substrate is removed from the strained layer, the semiconductor layer remaining bonded to the insulator layer.

One or more of the following features may be included. The semiconductor layer may be substantially relaxed. The semiconductor layer and/or the strained layer may include at least one of a group II, a group III, a group IV, a group V, and a group VI element. The semiconductor layer may include germanium and the strained layer may include silicon.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method for forming a structure, the method comprising:
   providing a first substrate having a graded layer disposed thereon, a relaxed layer disposed on the graded layer, the first substrate further having a first strained semiconductor layer having a first strain type and disposed on the relaxed layer, and the first substrate further having a second strained semiconductor layer having a second strain type disposed on the first strained semiconductor layer, wherein the providing the first substrate comprises providing a cleave plane in the relaxed layer;
   bonding the second strained semiconductor layer directly to an insulator layer disposed on a second substrate;
   removing the first substrate from the first strained semiconductor layer, wherein removing the first substrate from the first strained semiconductor layer comprises cleaving, the cleaving separates the relaxed layer into two portions at the cleave plane, the first strained semiconductor layer and second strained semiconductor layer remaining bonded to the insulator layer; and
   planarizing the first strained semiconductor layer where the relaxed layer has been removed, the planarizing the first strained semiconductor layer comprises an anneal performed at a temperature greater than approximately 800° C.

2. The method of claim 1, wherein the second strain type is opposite of the first strain type.

3. The method of claim 2, wherein the first strained semiconductor layer is the only semiconductor layer of the first strain type on the first substrate, the first strained semiconductor layer being in direct contact with the relaxed layer.

4. The method of claim 3, wherein the first substrate further comprises only one semiconductor layer of the second strain type, the only one second strained semiconductor layer in direct contact with the first strained semiconductor layer.

5. The method of claim 1, further comprising:
   before bonding the second strained semiconductor layer directly to the insulator layer disposed on the second substrate, performing a step to increase a bond strength between the second strained semiconductor layer and the insulator layer disposed on the second substrate.

6. The method of claim 5, wherein bonding comprises achieving a bond strength greater than or equal to about 1000 milliJoules/meter squared ($mJ/m^2$) at a temperature less than approximately 600° C.

7. The method of claim 5, wherein the step to increase bond strength comprises plasma activation of at least one of a surface of the second strained semiconductor layer and a surface of the insulator layer prior to the bonding the second strained semiconductor layer.

8. The method of claim 5, wherein the step to increase bond strength comprises planarizing by CMP a surface of the first strained semiconductor layer prior to bonding the first strained semiconductor layer.

9. The method of claim 1, wherein the first strained semiconductor layer has an initial misfit dislocation density prior to the bonding, wherein removing the first substrate comprises reducing the initial misfit dislocation density in the first strained semiconductor layer.

10. The method of claim 1, wherein providing the cleave plane in the relaxed layer comprises:
    implanting a dopant through the first strained semiconductor layer into the relaxed layer to form the cleave plane in the relaxed layer.

11. The method of claim 1, wherein providing the cleave plane in the relaxed layer comprises:
    before disposing the first strained semiconductor layer on the relaxed layer, implanting a dopant into the relaxed layer to form the cleave plane in the relaxed layer; and
    epitaxially growing the first strained semiconductor layer on the relaxed layer at a growth temperature less than 500° C.

12. A method for forming a structure, the method comprising:
    forming a relaxed layer over a first substrate, the relaxed layer comprising a cleave plane;
    forming a first strained semiconductor layer on the relaxed layer, a first surface of the first strained semiconductor layer on the relaxed layer, the first strained semiconductor layer having a first strain type;
    forming a second strained semiconductor layer on a second surface of the first strained semiconductor layer, the second strained semiconductor layer having a second strain type opposite the first strain type;
    bonding the second strained semiconductor layer to a second substrate;
    removing the first substrate from the first strained semiconductor layer by separating the relaxed layer into two portions at the cleave plane, the first strained semiconductor layer and second strained semiconductor layer remaining bonded to the second substrate;
    removing the relaxed layer from the first strained semiconductor layer with a first process to expose the first surface of the first strained semiconductor layer; and after the relaxed layer is removed, planarizing the exposed first surface of the first strained semiconductor layer with a second process, the second process being a different process than the first process.

13. The method of claim 12, further comprising:
forming a graded layer on the first substrate;
wherein the relaxed layer is formed on the graded layer.

14. The method of claim 12, wherein a first lattice constant of a material of the first strained semiconductor layer is mismatched with a second lattice constant of a material of the second strained semiconductor layer, the lattice mismatch inducing strain in the second strained semiconductor layer.

15. The method of claim 12, wherein the bonding the second strained semiconductor layer to the second substrate comprises bonding the second strained semiconductor layer directly to an insulator layer disposed on the second substrate.

16. The method of claim 12, wherein the forming the first strained semiconductor layer comprises forming only one first strained semiconductor layer, the only one first strained semiconductor layer in direct contact with the relaxed layer.

17. The method of claim 16, wherein the forming the second strained semiconductor layer comprises forming only one second strained semiconductor layer, the only one second strained semiconductor layer in direct contact with the first strained semiconductor layer.

18. A method for forming a structure, the method comprising:
forming a relaxed layer directly on a first substrate, the relaxed layer comprising a cleave plane;
forming a first strained semiconductor layer directly on the relaxed layer, the first strained semiconductor layer having a first strain of a first strain type induced by the relaxed layer;
forming a second strained semiconductor layer directly on the first strained semiconductor layer, the second strained semiconductor layer having a second strain of a second strain type opposite the first strain type, the second strain induced by the first strained semiconductor layer;
bonding the second strained semiconductor layer directly to an insulator disposed on a second substrate, the second strain substantially maintained after the bonding;
removing the first substrate and the relaxed layer from the first strained semiconductor layer, the removing the first substrate comprising cleaving the relaxed layer into two portions at the cleave plane, the first strained semiconductor layer and second strained semiconductor layer remaining bonded to the insulator after the removing; and
planarizing the first strained semiconductor layer where the relaxed layer has been removed.

19. The method of claim 18, wherein the first strained semiconductor layer has an initial misfit dislocation density prior to the bonding, wherein removing the first substrate comprises reducing the initial misfit dislocation density in the first strained semiconductor layer.

20. The method of claim 18, wherein the first strain type is tensile strain and the second strain type is compressive strain.

* * * * *